(12) United States Patent
Meikle et al.

(10) Patent No.: US 6,730,954 B2
(45) Date of Patent: May 4, 2004

(54) METHOD OF DEPOSITING TUNGSTEN NITRIDE USING A SOURCE GAS COMPRISING SILICON

(75) Inventors: Scott Meikle, Boise, ID (US); Trung Doan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/004,714

(22) Filed: Dec. 5, 2001

(65) Prior Publication Data

US 2002/0045322 A1 Apr. 18, 2002

Related U.S. Application Data

(62) Division of application No. 09/537,238, filed on Mar. 28, 2000, now Pat. No. 6,472,323, which is a division of application No. 08/977,800, filed on Nov. 25, 1997, now Pat. No. 6,429,086, which is a continuation of application No. 08/667,907, filed on Jun. 12, 1996, now Pat. No. 5,691,235, which is a continuation of application No. 08/348,646, filed on Nov. 30, 1994, now abandoned.

(51) Int. Cl.$^7$ .............................................. H01L 27/108
(52) U.S. Cl. ........................ 257/306; 438/680; 438/685
(58) Field of Search ................. 257/296, 301, 257/303, 304, 306–8, 310–1; 438/171, 190, 210, 238, 386, 387, 396, 393, 399, 680, 685

(56) References Cited

U.S. PATENT DOCUMENTS

| 4,238,872 A | 12/1980 | Akashi ................. 24/205.11 F |
| 4,774,201 A | 9/1988 | Woo et al. ..................... 437/41 |
| 4,823,182 A | 4/1989 | Okumura ..................... 357/67 |
| 4,847,111 A | 7/1989 | Chow et al. ................... 427/38 |
| 4,884,123 A | 11/1989 | Dixit et al. .................... 357/71 |
| 4,923,715 A | 5/1990 | Matsuda et al. ............. 427/237 |
| 4,960,732 A | 10/1990 | Dixit et al. ................... 437/192 |
| 4,974,056 A | 11/1990 | Brodsky et al. ............... 357/71 |
| 5,124,780 A | 6/1992 | Sandhu et al. ................. 357/67 |
| 5,132,756 A | 7/1992 | Matsuda ...................... 257/763 |
| 5,150,276 A | 9/1992 | Gonzalez et al. ........... 361/303 |
| 5,168,073 A | 12/1992 | Gonzalez et al. ............. 437/47 |
| 5,187,557 A | 2/1993 | Zenke ......................... 257/310 |
| 5,192,703 A | 3/1993 | Lee et al. ...................... 437/52 |
| 5,227,323 A | 7/1993 | Nishitsuji et al. .............. 437/47 |
| 5,238,872 A | 8/1993 | Thalapaneni et al. ........ 437/176 |
| 5,290,609 A | 3/1994 | Horiike et al. .............. 427/576 |
| 5,336,638 A | 8/1994 | Suzuki et al. ............... 437/190 |
| 5,341,015 A | 8/1994 | Prall et al. ................... 257/412 |
| 5,341,016 A | 8/1994 | Prall et al. ................... 257/412 |
| 5,487,923 A | 1/1996 | Min et al. .................... 427/569 |
| 5,691,235 A | 11/1997 | Meikle et al. ............... 437/190 |
| 5,861,675 A | 1/1999 | Sasaki et al. ................ 257/764 |
| 5,888,588 A | 3/1999 | Nagabushmnam et al. ...... 427/248.1 |

FOREIGN PATENT DOCUMENTS

| JP | 60-193333 | 10/1985 | |
| JP | 02-177427 | 7/1990 | |
| JP | 05-129231 | 5/1993 | ......... H01L/21/285 |
| JP | 05-236282 | 9/1993 | ......... H01L/21/285 |
| JP | 6-275776 | 9/1994 | ........... H01L/27/04 |

OTHER PUBLICATIONS

Wolf, Stanley; Silicon Processing for the VLSI Era, vol. 2: Process Integration, 1990. Lattice Press, pp. 609–615.*

(List continued on next page.)

*Primary Examiner*—Wael Fahmy
*Assistant Examiner*—Ginette Peralta
(74) *Attorney, Agent, or Firm*—Schwegman, Lundberg, Woessner & Kluth, P.A.

(57) ABSTRACT

A method for depositing tungsten nitride uses a source gas mixture having a silicon based gas for depositing the tungsten nitride to overlie a deposition substrate. A non-planar storage capacitor has a tungsten nitride capacitor electrode.

37 Claims, 2 Drawing Sheets

OTHER PUBLICATIONS

*Patent Abstracts of Japan*, vol. 18, No. 684 (E–1650), Dec. 22, 1994 & JP–A–6275776 Sep. 30, 1994.

Stahl Und Eisen, 74(5), 291–302, (1954).

Kim, et al., "New method to improve the adhesion strength of tungsten thin film on silicon by W2N glue layer", *Appl. Phys. Lett.*, 61 (5), 537–539, (Aug. 3, 1992).

Lahav, et al., "Measurement of thermal expansion coefficients of W, Wsi, WN and WSin thin film metallizations", *J. Appl. Phys.*, 67 (2), 734–738, (Jan. 1990).

Nakajima, et al., "Preparation of Tungsten Nitride Film by CVD Method Using WF6", *J. Electroshem. Soc.: Solid State Science and Technology*, vol. 134, No. 12, 3175–3178, (Dec. 1987).

* cited by examiner

METHOD OF DEPOSITING TUNGSTEN NITRIDE USING A SOURCE GAS COMPRISING SILICON

RELATED APPLICATIONS

This application is a Divisional of U.S. Ser. No. 09/537,238, filed Mar. 28, 2000 now U.S. Pat. No. 6,472,323 which is a Divisional of U.S. Ser. No. 08/977,800, filed Nov. 25, 1997 now U.S. Pat. No. 6,429,086, which is a Continuation of U.S. Ser. No. 08/667,907, filed Jun. 12, 1996, now U.S. Pat. No. 5,691,235, issued Nov. 25, 1997, which is a Continuation of U.S. Ser. No. 08/348,646, filed Nov. 30, 1994, now abandoned, which are incorporated herein by reference.

FIELD OF THE INVENTION

The invention relates to processes for fabricating dynamic random access memories, and more particularly to the deposition of tungsten nitride.

BACKGROUND OF THE INVENTION

Tungsten nitride has been shown to be an extremely promising material for planar capacitor and gate electrode applications. Tungsten nitride is stable at high temperatures and prevents dielectric degradation in capacitor applications and acts as a barrier between polycrystalline silicon and tungsten when used as a low resistivity strapping layer in a gate electrode. In one fabrication method Alex Lahav, Karen A. Grim, and Ilan A. Blech, as described in their article, "Measurement of Thermal Expansion Coefficients of W, WSi, WN, and WSiN Thin Film Metallizations," Journal of Applied Physics 67(2), Jan. 15, 1990, page 734, prepare tungsten nitride using reactive sputtering and obtain good film properties.

Although sputtering can provide high quality films, surface step coverage is inadequate for many applications. It would be preferred to have an improved step coverage process such as chemical vapor deposition (CVD).

Nakajima et al. in an article entitled "Preparation of Tungsten Nitride Film by CVD Method Using $WF_6$," appearing in the December 1987 edition of the Journal of Electrochemical Society: SOLID-STATE SCIENCE AND TECHNOLOGY, has demonstrated chemical vapor deposition of tungsten nitride from $NH_3$ and $WF_6$ source gases in a conventional hot wall CVD system. Although hot wall CVD systems offer an advantage with respect to wafer throughput, process control and cleanliness are typically not adequate for state-of-the-art applications. Rather, single wafer cold wall deposition systems are preferred.

For a CVD process $WF_6$ and $NH_3$ offer the advantages of being readily available and providing high deposition rates. However, $WF_6$ and $NH_3$ form an adduct at low temperatures (<50° C.), and even with a cold wall system there is a minimum acceptable wall temperature to prevent adduct formation. Furthermore, byproducts of the deposition reactions can cause encroachment into silicon or polycrystalline silicon substrates and therefore the process must be modified to reduce encroachment without compromising adhesion or resistivity.

Thus, there exists a need for a CVD tungsten nitride process having good adhesion and high deposition rates while providing conformal, low resistivity films with minimal silicon encroachment.

SUMMARY OF THE INVENTION

The invention is a method for depositing tungsten nitride using chemical vapor deposition. The method uses a source gas mixture having a silicon based gas for depositing the tungsten nitride to overlie a deposition substrate.

The method is useful in the fabrication of a capacitor electrode, a contact plug, and a gate electrode due to the good adhesion, minimal silicon encroachment and low resistivity of the tungsten nitride deposited according to the method of the invention.

The invention is a non-planar storage capacitor having a tungsten nitride capacitor electrode.

BRIEF DESCRIPTION OF THE DRAWINGS

FIG. 1 is a cross-sectional view of a portion of a semiconductor substrate having various structures fabricated thereon and having a first capacitor electrode.

FIG. 2 is the cross-sectional view of FIG. 1 following the creation of a dielectric layer.

FIG. 3 is the cross-sectional view of FIG. 2 following the creation of a tungsten nitride electrode.

DETAILED DESCRIPTION

The invention is a tungsten nitride layer formed by a process of the invention in which the tungsten nitride is chemically vapor deposited from a source gas comprising a silicon based gas, such as silane. In one embodiment the invention is a semiconductor non-planar storage capacitor having a tungsten nitride capacitor electrode and is the method for forming the non-planar capacitor. Although the invention is applicable to any number of non-planar capacitors, including trench capacitors and a variety of stacked capacitors, FIGS. 1–3 depict the process steps for fabricating a stacked capacitor of the invention.

Figure 1:
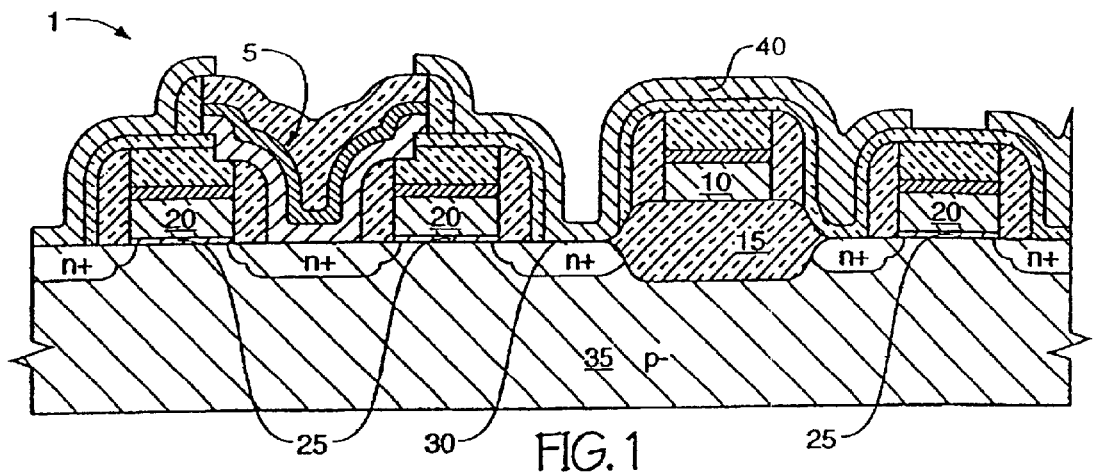
FIGS. 1–3 are cross sectional views of a semiconductor during various fabrication steps.

FIG. 1 is a cross-sectional view of a partially processed semiconductor device 1 having a buried bit line 5, a wordline 10 overlying a field oxide layer 15, and field effect transistors 20. A thin oxide layer 25 has been removed from a contact area 30 of the substrate 35 and a polycrystalline silicon (herein after also "polysilicon" or "poly") layer 40 has been deposited to overly the substrate 35 and contact the contact area 30 of the substrate 35. The poly layer 40 has been doped and patterned with a photo mask (not shown) to create a storage node plate or first electrode of the capacitor of the invention.

Figure 2:
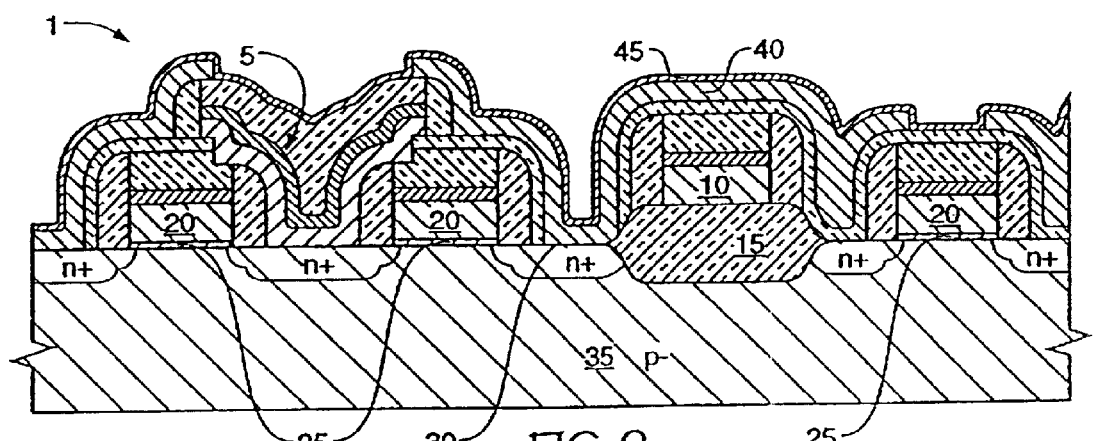

In FIG. 2 a dielectric layer 45, preferably tantalum oxide, is deposited to overly the polycrystalline silicon layer 40.

Figure 3:
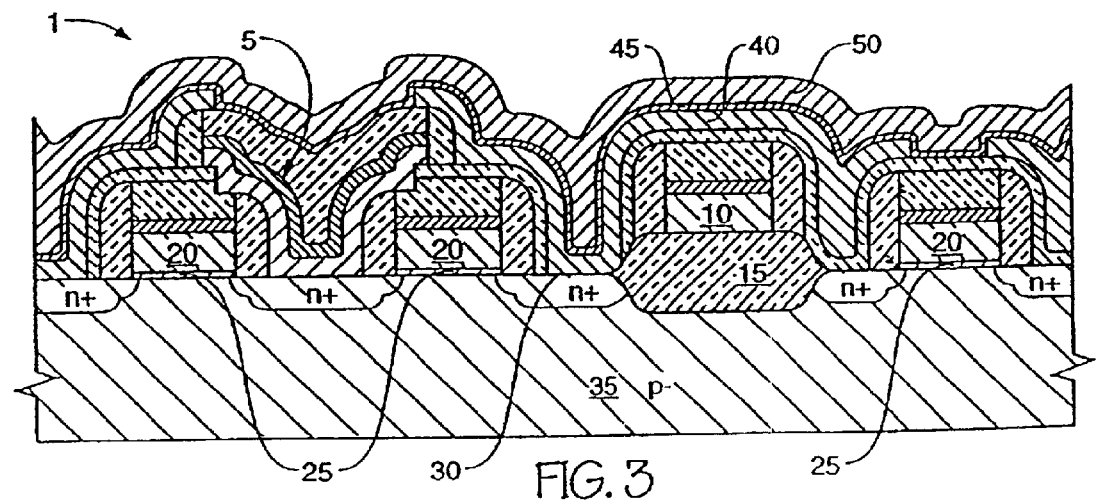

In FIG. 3 a tungsten nitride layer 50 is conformally deposited by chemical vapor deposition in a deposition chamber to overlie the dielectric layer 45 thereby forming a second electrode of the storage capacitor. During the chemical vapor deposition a source gas having at least a tungsten source such as tungsten hexaflouride combined with ammonia is combined with carrier gases which may include argon, hydrogen, nitrogen, or other gases. Alternate tungsten sources such as tungsten carbonyl may also be used. In a preferred embodiment the source gas also comprises a silicon based gas such as silane, organic silane, or a compound which is a multiple order of silane, such as di-silane and tri-silane. The source gas is maintained at a pressure conducive to chemical vapor deposition, typically within the range of pressures between 0.1 and 100 Torr including the end points. The temperature of the deposition substrate is maintained at 300° C., although other temperatures may be used. The temperature of the deposition chamber walls are held at a temperature which minimizes adduct formation, in this embodiment the walls are held at a temperature greater then 25° C. although other temperatures lower than the temperature of the deposition substrate will minimize adduct formation. In one embodiment the source gas comprises tungsten hexaflouride, ammonia, argon, and hydrogen. In this case during deposition of the tungsten nitride layer 20 the tungsten hexaflouride, ammonia, argon, and hydrogen have flow rates of 50 sccm, 150 sccm, 80 sccm and 80 sccm respectively. When silane is added to the source gas mixture the flow rate of the silane is equal to 4 sccm which is 1.098% of the total flow rate of the source gas mixture with the added silane.

In the capacitor of the invention and in other applications the addition of silane to the source gas reduces encroachment into any silicon based materials exposed to the tungsten nitride, improves adhesion of the tungsten nitride to its underlying layer, and reduces the bulk resistivity of the tungsten nitride. For most applications the flow rate of the silane or other silicon based gases should fall within the range of 0.5% to 5% of the total flow rate of the source gas comprising the silicon based gas, although flow rates from 0.1% to 25% of the total flow rate may be used.

It is possible to form the first electrode of the capacitor of the invention using the tungsten nitride when deposited according to the method described above. It is also conceivable that only the first electrode is tungsten nitride. In this case the second electrode overlying the dielectric may be some other material such as polysilicon.

Figure 4A:
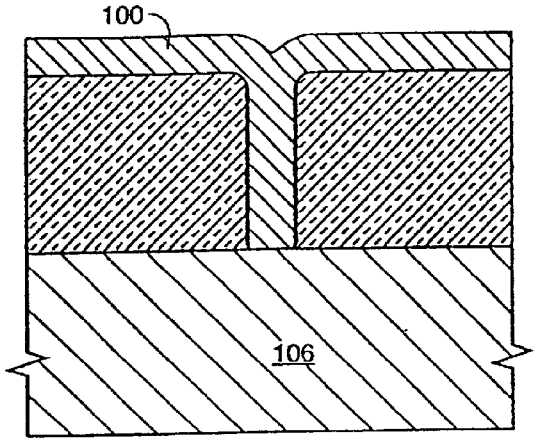
FIG. 4A is a cross-sectional view of a via formed in a substrate and filled with a layer of tungsten nitride.
Figure 4B:
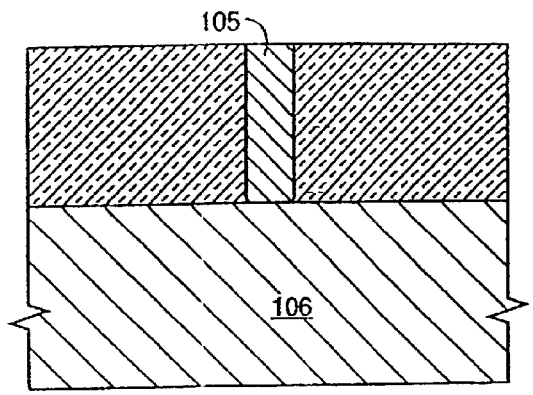
FIG. 4B is the cross-sectional view of FIG. 4A following a chemical mechanical planarization of the tungsten nitride layer of FIG. 4A.

In one embodiment the chemical vapor deposition of tungsten nitride using a source gas comprising silane is used to fill a via with tungsten nitride 100, see FIG. 4A. FIG. 4B shows the tungsten nitride contact plug 105 after chemical mechanical polishing of the tungsten nitride layer 100 shown in FIG. 4A. The contact plug 105 contacts the conductive layer 106.

Alternately the tungsten nitride may be deposited using a source gas comprising silane wherein the deposited tungsten nitride does not fill the via but rather lines the via forming a barrier material. In this case tungsten is deposited to fill the portions of the via not filled by the tungsten nitride.

Figure 5:
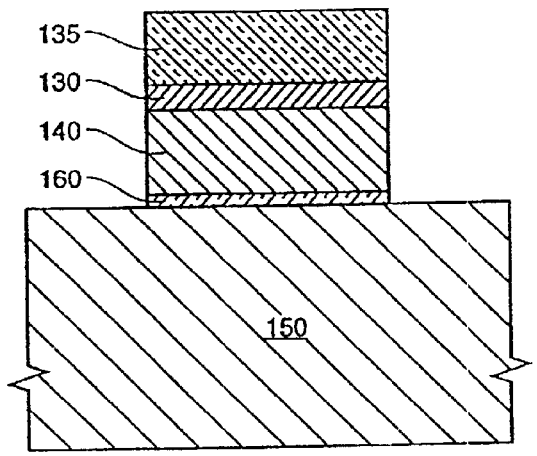
FIG. 5 is a cross-sectional view of a gate electrode having a tungsten nitride barrier layer.

In a further embodiment shown in FIG. 5 the chemical vapor deposition of tungsten nitride from a deposition gas comprising silane is used in field effect transistor applications to create a tungsten nitride barrier layer 130 interposed between a tungsten layer 135 and polycrystalline silicon layer 140. In this case exposed portions of the tungsten nitride 130, the tungsten layer 135 and the polycrystalline silicon layer 140 are removed in unpatterned areas to form a gate electrode 45 overlying substrate 150 and gate oxide 160 from masked portions of the tungsten nitride 130, the tungsten layer 135, and the polycrystalline silicon layer 140. In an alternate embodiment no polycrystalline silicon layer 140 is formed and the gate electrode comprises the tungsten nitride 130 and the tungsten layer 135.

Although specific embodiments have been described the invention should be read as limited only by the claims.

What is claimed is:

1. An integrated circuit capacitor comprising:
    a first electrode formed of polysilicon;
    a second electrode formed of chemically vapor deposited tungsten nitride formed using a gas comprising nitrogen, tungsten and silicon; and
    a dielectric layer located between the first and second electrodes.

2. The integrated circuit capacitor of claim 1 wherein the dielectric layer is comprised of tantalum oxide.

3. The integrated circuit capacitor of claim 1 wherein the capacitor is a memory cell.

4. A capacitor, comprising:
    a first electrode;
    a second electrode; and
    a dielectric disposed between the first and the second electrode,
    wherein at least one of the first electrode and the second electrode includes a tungsten nitride layer, and the tungsten nitride layer includes silicon.

5. The capacitor of claim 4, wherein both the first electrode and the second electrode includes a tungsten nitride layer, and the tungsten nitride layer includes silicon.

6. The capacitor of claim 4, wherein the capacitor is a non-planar capacitor.

7. The capacitor of claim 4, wherein the dielectric includes tantalum oxide.

8. The capacitor of claim 4, wherein the tungsten nitride prevents degradation of the dielectric.

9. A capacitor, comprising:
    a first electrode;
    a dielectric disposed on the first electrode; and
    a second electrode formed on the dielectric as a layer of tungsten nitride, the layer of tungsten nitride including silicon.

10. The capacitor of claim 9, wherein the capacitor is a non-planar capacitor.

11. The capacitor of claim 9, wherein the dielectric includes tantalum oxide.

12. The capacitor of claim 9, wherein the layer of tungsten nitride is conformally deposited by chemical vapor deposition.

13. The capacitor of claim 9, wherein the layer of tungsten nitride is exposed to silicon based materials, and wherein a boundary between the layer of tungsten nitride and the silicon based materials is characterized by a reduced encroachment of the tungsten nitride into the silicon based materials.

14. The capacitor of claim 9, wherein the first electrode is formed as a conformal polycrystalline silicon layer.

15. A capacitor, comprising:
    a first electrode formed as a layer of tungsten nitride, the layer of tungsten nitride including silicon;
    a dielectric disposed on the first electrode; and
    a second electrode formed on the dielectric.

16. The capacitor of claim 15, wherein the capacitor is a non-planar capacitor.

17. The capacitor of claim 15, wherein the dielectric includes tantalum oxide.

18. The capacitor of claim 15, wherein the layer of tungsten nitride is conformally deposited by chemical vapor deposition.

19. The capacitor of claim 15, wherein the layer of tungsten nitride is exposed to silicon based materials, and wherein a boundary between the layer of tungsten nitride and the silicon based materials is characterized by a reduced encroachment of the tungsten nitride into the silicon based materials.

20. The capacitor of claim 15, wherein the second electrode is formed as a polycrystalline silicon layer.

21. A non-planar capacitor, comprising:
a polycrystalline silicon film;
a dielectric layer disposed on the polycrystalline film; and
a film of tungsten nitride disposed on the dielectric layer, the film of tungsten nitride including silicon.

22. The non-planar capacitor of claim 21, wherein the polycrystalline silicon film is a conformal film formed over a substrate and over transistor devices on the substrate.

23. The non-planar capacitor of claim 21, wherein the dielectric layer includes tantalum oxide.

24. The non-planar capacitor of claim 21, wherein the film of tungsten nitride is conformally deposited by chemical vapor deposition.

25. A non-planar capacitor, comprising:
a conformal polycrystalline silicon film formed over a substrate and over transistor devices on the substrate;
a dielectric layer formed on the conformal polycrystalline silicon film; and
a film of tungsten nitride conformally deposited on the dielectric layer by chemical vapor deposition, the film of tungsten nitride including silicon.

26. The non-planar capacitor of claim 25, wherein the film of tungsten nitride is formed by a chemical vapor deposition process that uses ammonia as a source of nitrogen and a gas selected from the group consisting of tungsten hexaflouride and tungsten carbonyl as a source of tungsten.

27. The non-planar capacitor of claim 25, wherein the film of tungsten nitride is formed by a chemical vapor deposition process that uses a source gas mixture that includes:
ammonia;
a gas selected from the group consisting of tungsten hexaflouride and tungsten carbonyl; and
a gas selected from the group consisting of silane, organic silane, and a compound that is a multiple order of silane.

28. The non-planar capacitor of claim 25, wherein the dielectric layer includes tantalum oxide.

29. A non-planar capacitor, comprising:
a first electrode;
a dielectric layer formed on the first electrode; and
a film of tungsten nitride conformally deposited on the dielectric layer by chemical vapor deposition that uses gases, including:
ammonia;
a gas selected from the group consisting of tungsten hexaflouride and tungsten carbonyl; and
a gas selected from the group consisting of silane, organic silane, and a compound that is a multiple order of silane.

30. The non-planar capacitor of claim 29, wherein the first electrode includes a conformal polycrystalline silicon film formed over a substrate and over transistor devices on the substrate.

31. The non-planar capacitor of claim 29, wherein the gases used in the chemical vapor deposition process are a source gas mixture.

32. An integrated circuit, comprising:
a substrate;
at least one transistor device formed on the substrate and arranged to leave a contact area with the substrate;
a non-planar capacitor, including:
a first electrode;
a second electrode; and
a dielectric disposed between the first and the second electrode,
wherein at least one of the first electrode and the second electrode includes a tungsten nitride layer, and the tungsten nitride layer includes silicon.

33. The integrated circuit of claim 32, wherein both the first electrode and the second electrode includes a tungsten nitride layer, and the tungsten nitride layer includes silicon.

34. The integrated circuit of claim 32, wherein the first electrode includes a tungsten nitride layer, and the tungsten nitride layer includes silicon.

35. The integrated circuit of claim 32, wherein the second electrode includes a tungsten nitride layer, and the tungsten nitride layer includes silicon.

36. The integrated circuit of claim 32, wherein the dielectric includes tantalum oxide.

37. The integrated circuit of claim 32, wherein the tungsten nitride prevents degradation of the dielectric.

* * * * *